United States Patent
Chang et al.

[11] Patent Number: 6,004,829
[45] Date of Patent: Dec. 21, 1999

[54] METHOD OF INCREASING END POINT DETECTION CAPABILITY OF REACTIVE ION ETCHING BY ADDING PAD AREA

[75] Inventors: Tzong-Sheng Chang, Chang-Hua; Yen-Shih Ho, Chai-Yi; Ruey-Hsin Liou, Miao-Li; Yuan-Cheng Yu, Hsin-Chu, all of Taiwan

[73] Assignee: Taiwan Semiconductor Manufacturing Company, Hsin-Chu, Taiwan

[21] Appl. No.: 08/928,229

[22] Filed: Sep. 12, 1997

[51] Int. Cl.$^6$ .................................................. H01L 21/8238
[52] U.S. Cl. .......................... 438/16; 438/201; 438/257; 438/593
[58] Field of Search .................................. 438/201, 211, 438/257, 593, 14, 15, 265, 7, 9, 16; 257/314–316

[56] References Cited

U.S. PATENT DOCUMENTS

| | | | |
|---|---|---|---|
| 4,598,460 | 7/1986 | Owens et al. | 438/201 |
| 4,646,425 | 3/1987 | Owens et al. | 29/571 |
| 4,775,642 | 10/1988 | Chang et al. | 438/201 |
| 4,784,966 | 11/1988 | Chen | 438/201 |
| 4,829,024 | 5/1989 | Klein et al. | 437/189 |
| 5,091,327 | 2/1992 | Bergemont | 437/43 |
| 5,104,819 | 4/1992 | Freiberger et al. | 438/593 |
| 5,208,174 | 5/1993 | Mori | 438/593 |
| 5,286,667 | 2/1994 | Lin et al. | 437/52 |
| 5,498,559 | 3/1996 | Chang | 438/258 |
| 5,506,159 | 4/1996 | Enomoto | 438/201 |
| 5,527,727 | 6/1996 | Kim | 438/263 |
| 5,663,084 | 9/1997 | Yi et al. | 438/201 |
| 5,693,972 | 12/1997 | Liu | 257/315 |
| 5,705,419 | 1/1998 | Perry et al. | 438/593 |
| 5,731,243 | 3/1998 | Peng et al. | 438/612 |
| 5,840,595 | 11/1998 | Kobayashi | 438/16 |
| 5,892,276 | 4/1999 | Miki et al. | 257/100 |

*Primary Examiner*—Olik Chaudhuri
*Assistant Examiner*—Anh Duy Mai
*Attorney, Agent, or Firm*—George O. Saile; Stephen B. Ackerman; Graham S. Jones, II

[57] ABSTRACT

A method of forming a semiconductor device includes forming of layers of polysilicon and dielectric layers in manufacturing a semiconductor device and patterning the layers into devices using phototlithography and etching process steps. End point mode detection is used in the etching process in a way in which the area exposed during etching is increased to enhance the end point detection capacity, by adding a surplus pad area before pad formation. Specifically an EPROM device is formed with a first level of polysilicon above a gate oxide layer patterned into a floating gate electrode of an EPROM device. Then form an ONO layer above the floating gate electrode. Define array protection, grow a second gate oxide layer, deposit a second level of polysilicon, define peripheral gates from the second level of polysilicon, and define an EPROM transistor gate electrode from the second level of polysilicon.

7 Claims, 8 Drawing Sheets

METHOD OF INCREASING END POINT DETECTION CAPABILITY OF REACTIVE ION ETCHING BY ADDING PAD AREA

BACKGROUND OF THE INVENTION

1. Field of the Invention

This invention relates to manufacture of semiconductor devices and more particularly to end point detection in manufacture thereof.

2. Description of Related Art

U.S. Pat. No. 4,646,425 of Owens for "Method for Making a Self-Aligned CMOS EPROM wherein the EPROM Floating Gate and CMOS Gates Are Made from One Polysilicon Layer" describes a method of forming Floating EPROM and CMOS gates from a single polysilicon layer. A CMOS EPROM is made wherein the typical EPROM device is an N-channel IGFET Insulated Gate Field Effect Transistor) with its control gate self-aligned with its floating gate. The EPROM floating gate and the gates of both the P-channel and N-channel peripheral circuit transistors are formed from a first polysilicon layer and the control gate is formed from a later deposited polysilicon layer.

Owens states as follows: "Erasable programmable read only memories are well known in the semiconductor art. EPROM circuits include a matrix of EPROM devices, each of which stores a bit of information, and a plurality of peripheral transistor devices. Peripheral transistors are required for such functions as row decode and column decode of the EPROM matrix, latches and drivers."

"In addition to having a control gate similar to the control gate of the peripheral devices, EPROM devices have a floating gate positioned below the control gate. It is this floating gate which allows the EPROM device to store charge, thereby programming the EPROM device. Conversely, when the EPROM device is unprogrammed, the floating gate is uncharged."

"The architecture required places constraints on the size of the EPROM device. Since the floating gate must rest directly below the control gate, both gates must be large enough to allow their proper alignment. Self-alignment of both the control gate and the floating gate allows a reduction in the size of the EPROM device."

U.S. Pat. No. 5,286,667 of Lin et al. for "Modified and Robust Self-Aligning" shows a method of forming self-aligning contacts. A silicon nitride or silicon oxynitride barrier layer is used as an end point detection layer for the plasma etch. A method is described for making an IC device having a combination of a capacitor and MOSFET transistor with gate electrodes and source/drain regions using silicon nitride or silicon oxynitride barrier layers as a key to an LDD spacer etch process. The barrier layer aids in endpoint detection for the plasma etch. This allows for less loss of the field oxide and greater thickness control of the field oxide regions. Further, the silicon nitride endpoint detection allows for the removal of undesirable residual silicon oxide from the surface of the capacitor plate without loss of the polysilicon capacitor plate itself.

U.S. Pat. No. 4,829,024 of Klein et al. for "Method of Forming Layered Polysilicon Filled Contact by Doping Sensitive End Point Etching" describes a semiconductor process for forming a very low resistance contact. A straight wall contact is formed conventionally above a silicon substrate. Then a blanket metal barrier layer is deposited. Several planar polysilicon layers are deposited above the metal barrier layer. The polysilicon layers have varying doping levels and then the process of etched away those layers begins. By monitoring a by-product gas of the etch reaction the transition between polysilicon layers is monitored. In the contact region, a layer of doped polysilicon is left above the metal barrier. Metal may then be patterned over the entire structure to provide a low resistance reliable contact.

U.S. Pat. No. 5,091,327 of Bergemont for "Fabrication of a High Density Stacked Gate EPROM Split Cell with Bit Line Reach-Through and Interruption Immunity" describes a method for fabricating a split-gate EPROM cell utilizing stacked etch techniques. A layer of silicon dioxide is formed on a P-silicon substrate. A layer of polysilicon is formed on the silicon dioxide layer, followed by growth of an oxide/silicon nitride/oxide (ONO) layer. The ONO and polysilicon layers are etched to define floating gates. Next, an edge of each floating gate is utilized in a self-aligned implant of buried N+ bit lines. The floating gate extends only over a first portion of the channel defined between the adjacent buried bit lines. A differential oxide layer is grown on the substrate between adjacent floating gates in a low temperature steam oxidation step so the oxide formed over the exposed portion of the buried N+ bit line is thicker than the oxide formed over the exposed portion of the channel. Following formation of the differential oxide layer, a second layer of polysilicon is formed and etched to define control lines extending perpendicular to the floating gates in the conventional split-gate EPROM cell structure. The control gates are utilized in a stacked etch to complete the split-gate cells. The etch is carried out such that the oxide overlying the N+ bit lines protect the surface of the substrate, avoiding bit line interruption, while the silicon dioxide overlying the exposed portion of the channel is overetched to form a trench into the channel that extends below the junction depth of the N+ region, thereby eliminating bit line to bit line reach-through.

In some conventional cases, etching by the Reactive Ion Etching (RIE) process requires enough etching area to detect the End Point (E/P) signal, especially for embedded memory self-aligned etching, buried contact, emitter contact, etc. However, when there is less exposed area occupying a small portion of a chip, the result is the failure of end point detection as the etching process is performed. Although this problem can be solved by changing from the use of the end point (E/P) detection mode to the use of the time mode, the degree of overetching (O/E) and the Si-trench depth of Si in the chip will be uncontrollable, to a seriously degree, due to fluctuations of the E/R etching process.

SUMMARY OF THE INVENTION

The Lin et al. U.S. Pat. No. 5,286,667 does not teach leaving some polysilicon 1 on the wafer and using both the polysilicon 1 and the polysilicon 2 layers for the step of end point detection.

In order to use the end point mode in the etching process, the exposed area during etching needs to be increased. To permit the use of a new method to increase the end point detection capacity, a pad area is added before pad formation. This method can be employed for processing modules which have suffered the difficulty of detecting the end point when insufficient area is exposed for end point detection.

In accordance with this invention, a method is provided for forming a semiconductor device comprising the following steps. First, form a series of layers of metallization and dielectric layers in manufacturing a semiconductor device and patterning the layers into devices. Then, use phototlithography and etching process steps, and use end point mode detection in the etching process, wherein the exposed area during etching is increased to enhance the end point detection capacity, by adding a surplus pad area before pad formation.

Preferably, form a MOSFET device including forming a series of layers of metallization and dielectric layers in forming a semiconductor device and patterning the layers into devices using phototlithography and etching process steps, including the following steps. Form a first polysilicon electrode layer above a first gate oxide layer on a substrate. Form an interelectrode dielectric layer defining array protection. Grow a second gate oxide layer, Deposit a second polysilicon electrode layer. Define peripheral gates, and define the main transistor gate electrode. Use end point mode detection in the etching process. Thus the area exposed during etching is increased to enhance the end point detection capacity, by adding a surplus pad areas before pad formation.

Preferably, form a MOSFET EPROM device including a series of layers of metallization and dielectric layers in forming a semiconductor device and patterning the layers into devices using phototlithography and etching process steps, including the following steps. Form a first polysilicon electrode layer above a gate oxide layer. Form an interconductor dielectric layer above the floating gate electrode. Pattern a floating gate electrode of an EPROM device from the first polysilicon electrode, the gate oxide layer and the interconductor dielectric layer. Define array protection. Grow a second gate oxide layer. Deposit a second polysilicon electrode layer. Define peripheral gates from the second level of polysilicon. Define an EPROM transistor control gate electrode from the second level of polysilicon, and use end point mode detection in the etching process, wherein the area exposed during etching is increased to enhance the end point detection capacity, by adding a surplus pad area before pad formation.

Preferably, the following steps are performed. Grow the gate oxide layer on the substrate with a thickness of about 25 nm, form the first polysilicon electrode layer on the first gate oxide layer, the first polysilicon electrode layer having a thickness of about 200 nm and being doped, forming an interconductor dielectric layer over the first polysilicon electrode layer, define a floating gate stack by etching the interconductor dielectric layer, the first polysilicon electrode layer and the first gate oxide layer and etch the first polysilicon electrode layer of the surplus pad areas in a pattern with margins; define the array protection including pad margins about the surplus pad areas; grow a second gate oxide layer over the device; deposit a second polysilicon electrode layer over the second gate oxide layer; define the peripheral gates from the second polysilicon electrode layer including surplus pad areas; define the cell polysilicon gate including the second polysilicon electrode layer, interconductor dielectric layer, and the first polysilicon electrode layer in a self-aligned etch wherein the surplus pad area is etched away; grow a silicon oxide pre-oxide layer; form cell N+ S/D regions in the substrate; depositing a blanket dielectric layer over the device; defining contact regions; deposit a metallization layer; and define the metallization regions in the conventional manner.

Preferably, the steps are performed to form the interconductor dielectric layer which include growing a polyoxide layer with a thickness of about 15 nm for a first film of the interconductor dielectric layer; depositing a silicon nitride layer with a thickness of about 15 nm for a second film of the interconductor dielectric layer; and forming an oxide on the silicon nitride layer with a thickness of about 2.5 nm for a third film of the interconductor dielectric layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
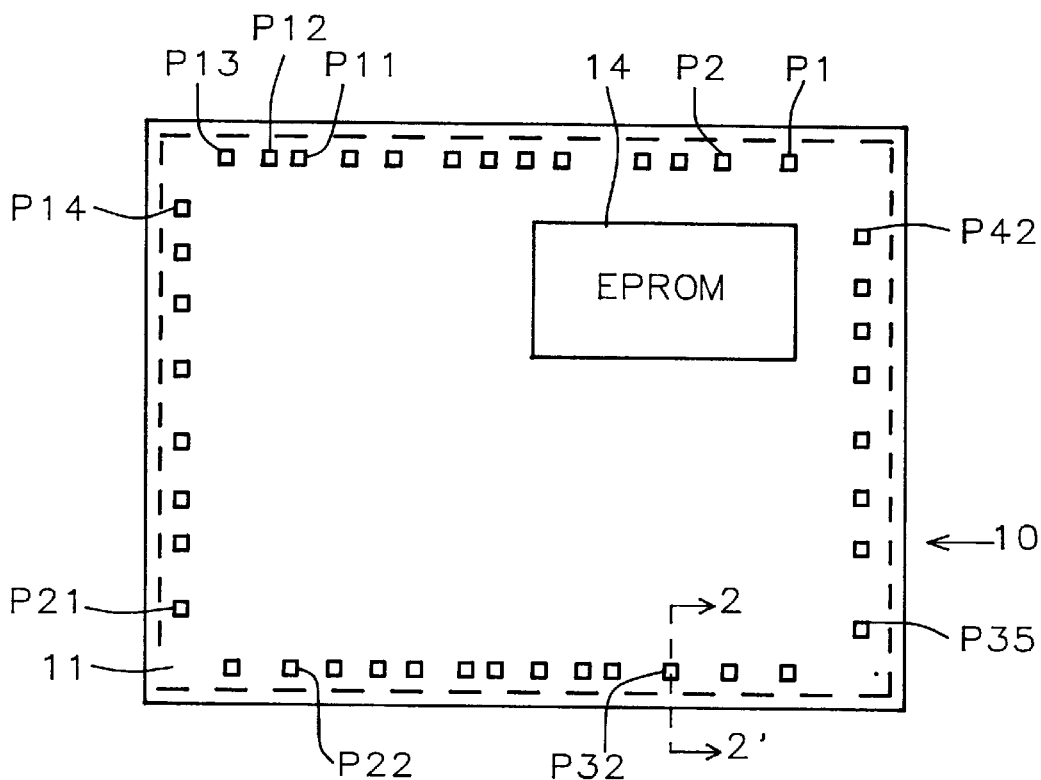
FIG. 1 shows a silicon, semiconductor chip in accordance with this invention with a silicon semiconductor substrate on which an EPROM region is formed along with a plurality of pads around the periphery of the chip.

FIG. 1 shows a silicon, semiconductor chip 10 in accordance with this invention with a P- type, boron-doped, silicon semiconductor substrate 11 on which an EPROM region 14 is formed along with a plurality of pads P1, P2, . . . P42 around the periphery of the chip 10.

Figure 2:
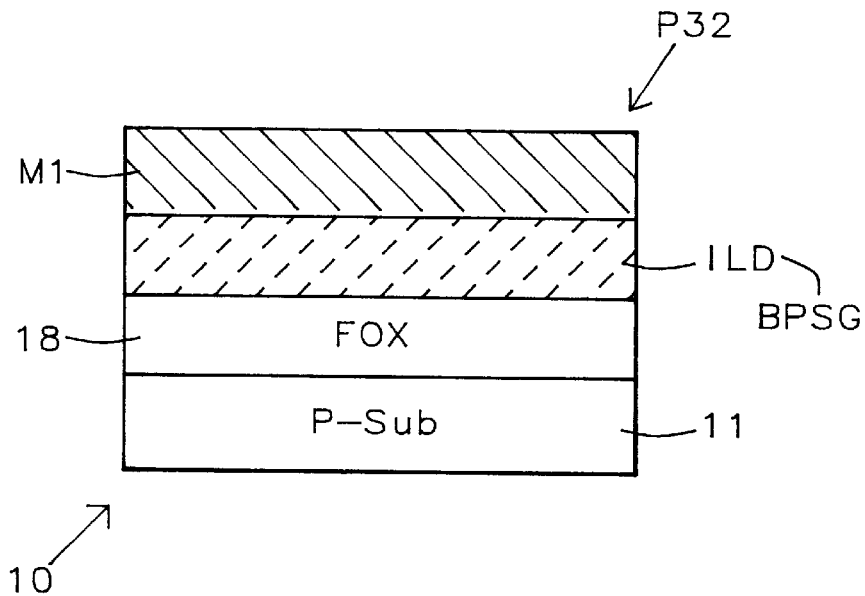
FIG. 2 shows a fragmentary sectional view taken along line 2-2' in FIG. 1 of a pad which is formed on the substrate and a FOX region in accordance with this invention.

FIG. 2 shows a fragmentary sectional view taken along line 2-2' in FIG. 1 of a pad P32 which is formed on the P-substrate 110 and a FOX region 18 before step 430, which will be etched off after step 430 in accordance with this invention. An Inter-Layer Dielectric layer ILD is formed over the FOX region 18. Above the dielectric layer ILD, metal layer M1 is formed.

Process Sequence

Figure 4A:
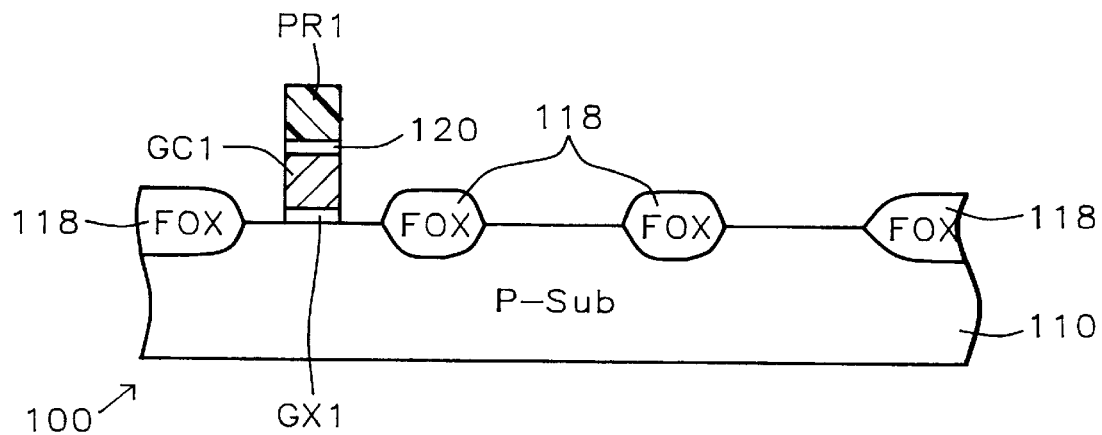
FIGS. 4A to 4H are sectional views of a fragment of an EPROM, MOSFET device shown in a series of stages of manufacture the device.

Referring to FIG. 4A, a sectional view of a fragment of an EPROM, MOSFET device 100 (like chip 10 in FIG. 1) is shown in the early stages of manufacture. Device 100 is formed on a P− type, boron-doped, silicon semiconductor substrate 110 (like substrate 11 in FIG. 1).

In the description below the steps of the method of this invention is described in detail with reference to the steps in the flow chart of FIGS. 3A and 3B.

Figure 3A:
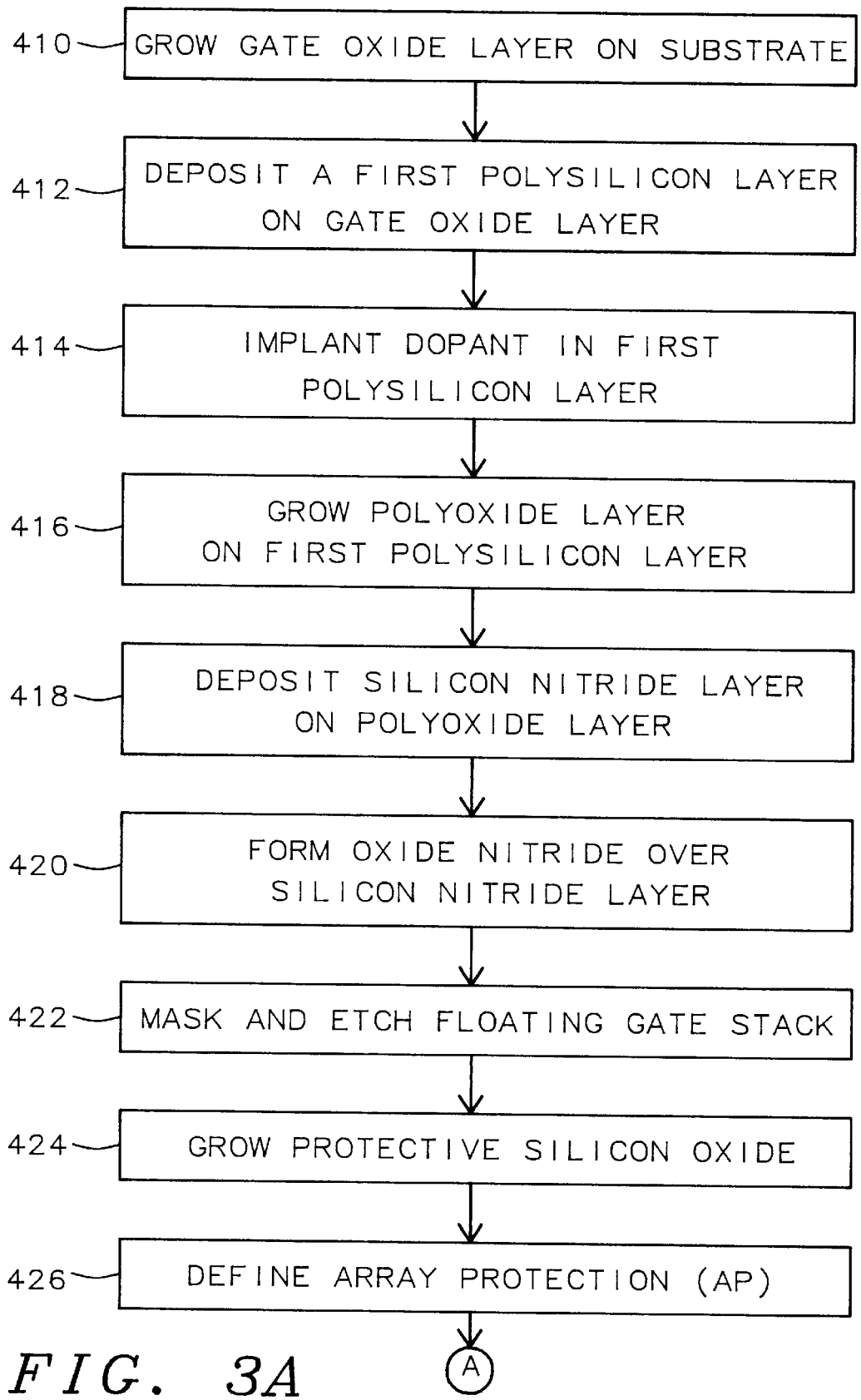
FIGS. 3A and 3B show a flow chart of the steps of the method of this invention.

Referring now to FIG. 3A, in step 410, a blanket gate oxide layer GX1 with a thickness of about 25 nm was grown on the substrate 110 along with a number of Field OXide (FOX) regions 118 between which transistor devices will be formed. The gate oxide layer has been patterned into gate oxide layer GX1 (of transistor T1 as seen in FIGS. 3A and 3B) of a floating gate stack for an EPROM device formed thereon, as described below.

In step 412, an unpatterned blanket, first polysilicon layer (polysilicon 1) GC1 with a thickness of about 200 nm was grown on the gate oxide layer GX1.

In step 414, the first polysilicon layer GC1 was doped by $_{31}P^+$ ion implantation to form $N^+$-type doped polysilicon layer GC1 in a relatively conventional process.

Forming silicon Oxide/silicon Nitride/silicon Oxide (ONO)

In steps 416, 418, 420 of FIG. 3A, an interconductor dielectric (ONO) multiple film layer 120 is formed by forming the three thin films of the conventional ONO variety of dielectric layer 120 as seen in FIG. 4A.

In step 416, the first ONO film comprises an oxide of the first polysilicon (polyoxide) layer GC1, with a thickness of about 23 nm which was grown on the doped, first polysilicon layer GC1.

In step 418, the second ONO film, which comprises a silicon nitride ($Si_3N_4$) film, is deposited with a thickness of about 15 nm over the polyoxide layer.

Then in step 420, the third (top) ONO film, which comprises an oxynitride film, is formed by a wet oxidation process performed on the silicon nitride to complete the ONO layer 120. The oxynitride film preferably has a thickness of about 2.5 nm.

Next, in step 422, the ONO layer 120 has a photoresist (PR) mask PR1 formed thereabove, patterned into the form of photoresist mask PR1 is shown in FIG. 4A. The ONO layer 120 and first polysilicon, conductor layer GC1 are etched to form the floating gate GC1 of ONO/polysilicon 1 and gate oxide GX1 to form the floating gate of transistor T1, as shown on the left end of the device 100 in FIG. 4B.

Conventional mask data: Poly 1

Invention mask data: Poly 1+(surplus pad area with a margin of about 4 $\mu$m).

Figure 4B:
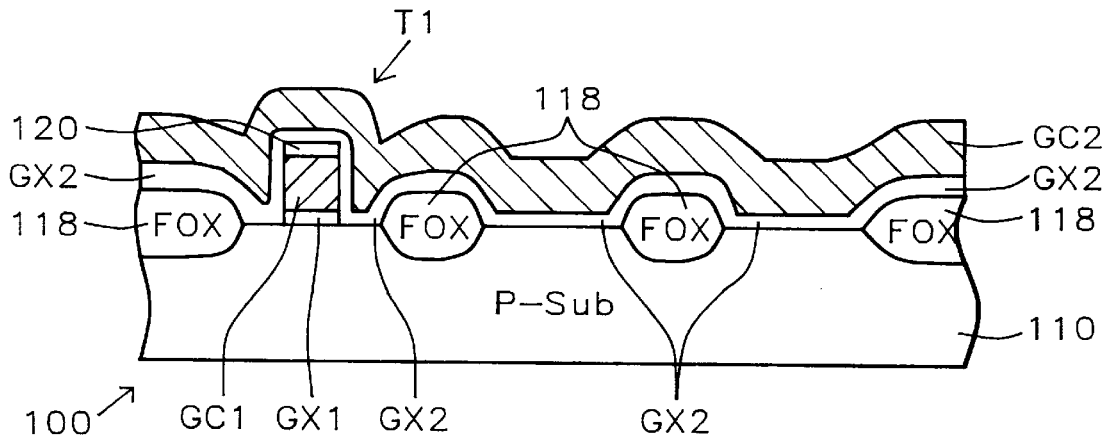
Figure 4C:
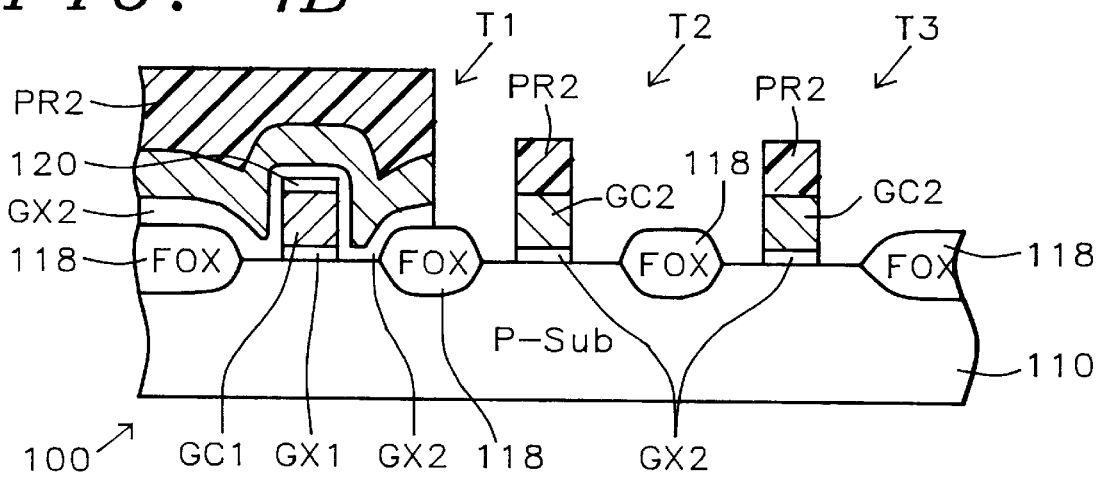
Figure 4D:
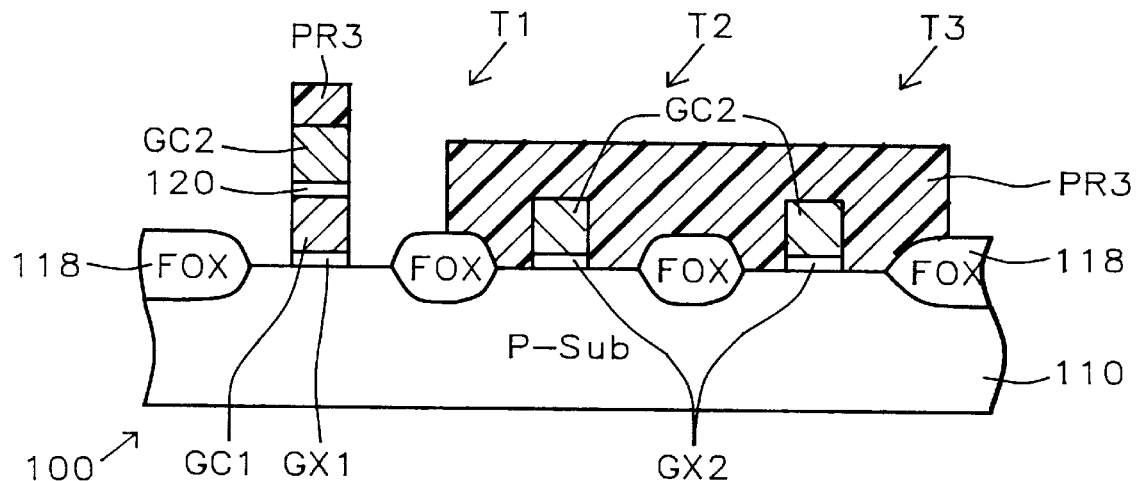
Figure 4E:
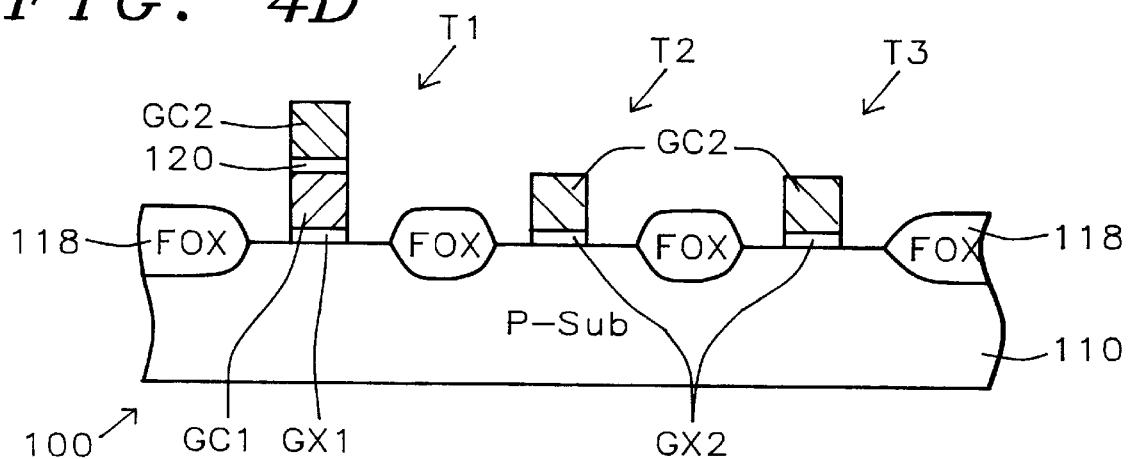
Figure 4F:
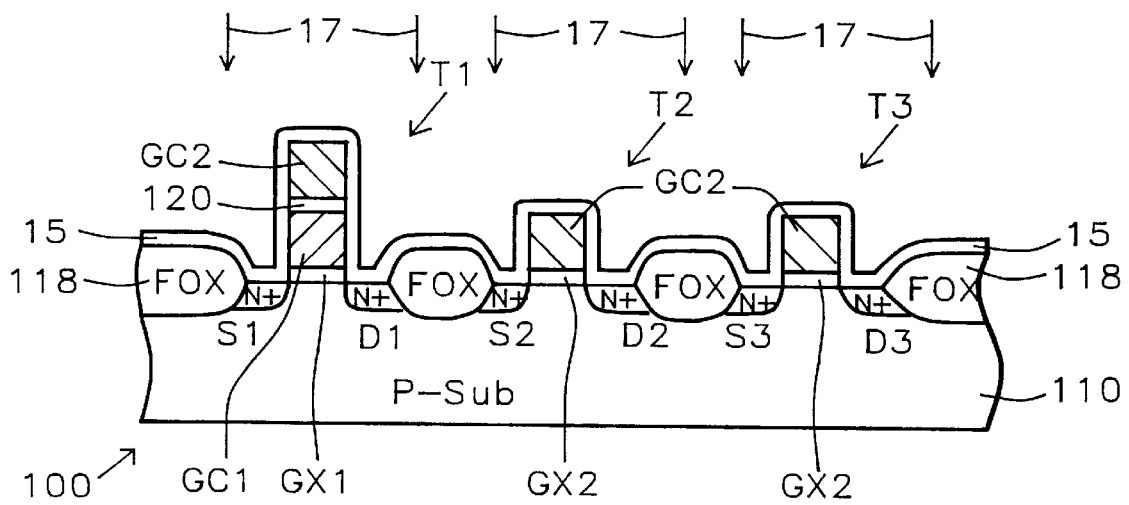
Figure 4G:
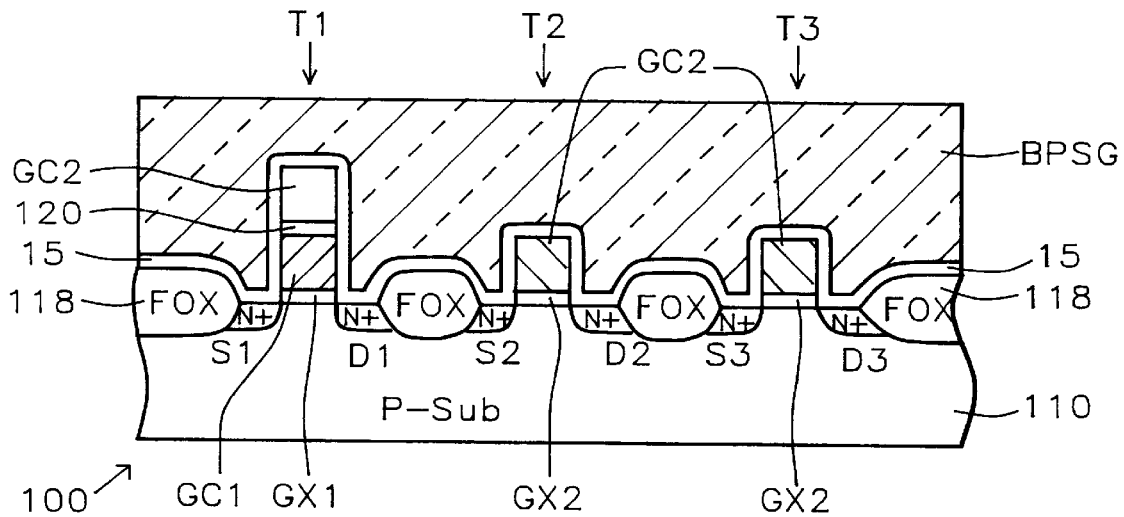
Figure 4H:
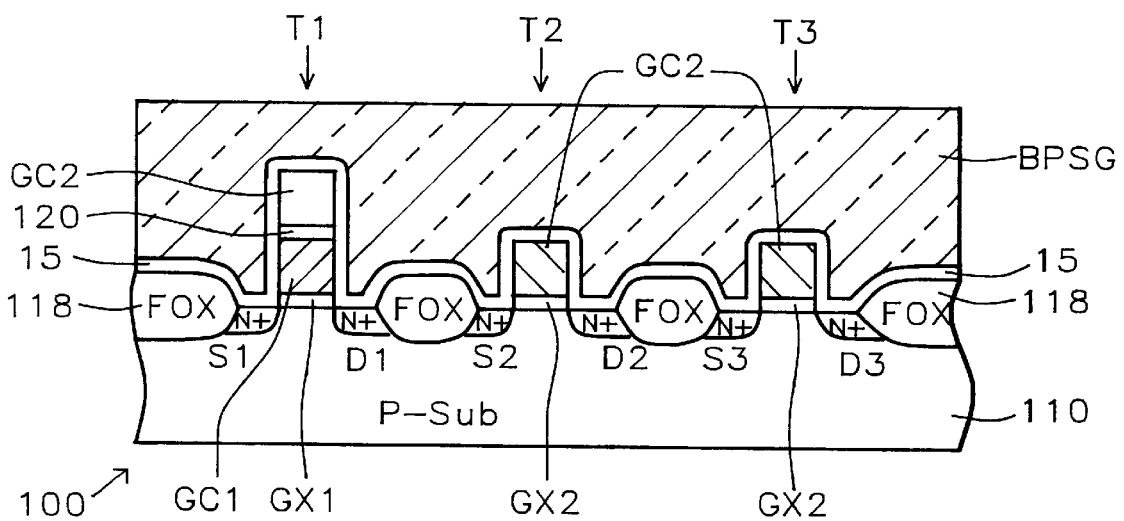
Figure 5A:
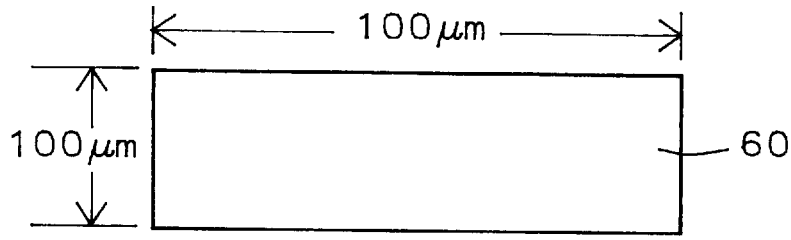
Referring to FIG. 5A a plan view of the device is shown for a relatively conventional AP region with conventional mask data On the other hand, there is a masked area shown in FIG. 5B in accordance with this invention in which the pad has been masked to a substantial degree, leaving a margin about the region seen in FIG. 5B during the masking and etching of the floating gate stack, providing surplus pad area.

Referring to FIG. 5A, a plan view of the pad metal area data for the polysilicon 1 layer is shown with relatively conventional mask "data". The "data" is the information translated from a symbolic electric circuit to the transistor layout for semiconductor processing. The pad metal material of FIG. 5A is defined for wiring outside the area of the FET devices in device 100 in FIGS. 4A–4H, the device 100 is a combination of numerous transistors which are formed by different layers patterned by a CAD (Computer Assisted Design) program providing "so-called" layout data. In FIG. 5A, none of the polysilicon 1 layer will remain in area 60 when a relatively conventional mask data is employed. That is to say, the relatively conventional patterning mask for the polysilicon 1 layer does not protect any of area 60 from removal. Thus, the remaining portion of the polysilicon 1 layer in area 60 would have been removed before the real pad had been defined. For purposes of illustration, pad 60 has dimensions of about 100 $\mu$m by 100 $\mu$m, which is shown as a rectangle, for convenience of illustration.

Figure 5B:
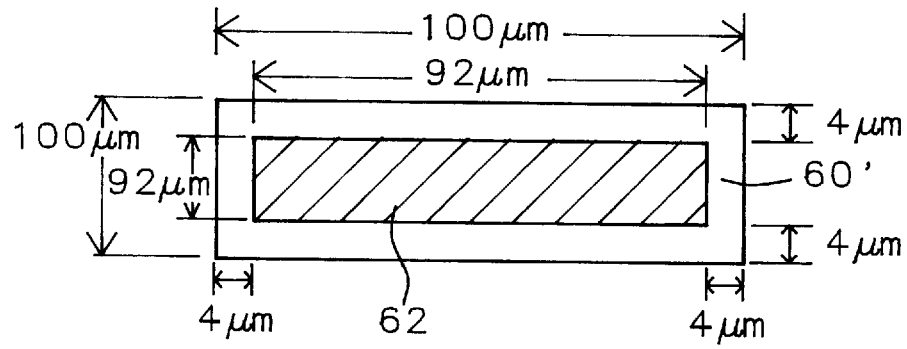

The pad 60' in FIG. 5B, in accordance with this invention, has a margin of about 4 $\mu$m for the surplus pad area from the new polysilicon 1 data area. Providing a "pad" with an margin of about 4 $\mu$m is done by a logical operation in layout computation. The new Poly 1 data area is region 62 inside the pad region 60'. Region 62 is marked with cross-hatching to indicate that the area of region 62 which will not to be etched in this step, in accordance with this invention. For purposes of illustration, region 62 has dimensions of about 92 $\mu$m by 92 $\mu$m.

Referring to FIG. 4B, in step 424 a blanket protective silicon dioxide (side oxide) layer GX2 is grown with a thickness from about 50 nm to about 60 nm over the entire device 100.

In step 426 the array protection (AP) mask is used during etching.

Conventional mask data: AP (Area Protection with PR Mask)

Invention mask data: AP (Mask)+(pad margin ~1 $\mu$m).

Figure 6A:
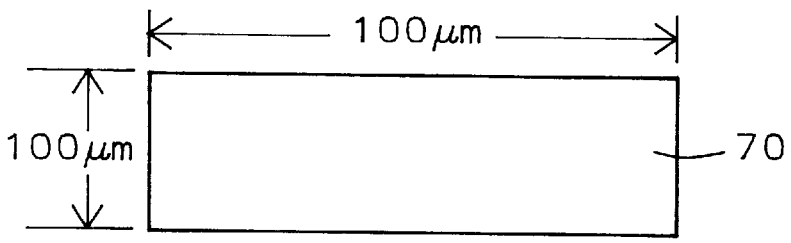
Referring to FIGS. 6A and 6B, plan views of the devices of FIGS. 5A and 5B, respectively, are shown at the stage of area protection in accordance with a relatively conventional process in the case of FIG. 6A or in accordance with the process of this invention in the case of FIG. 6B.
Figure 6B:
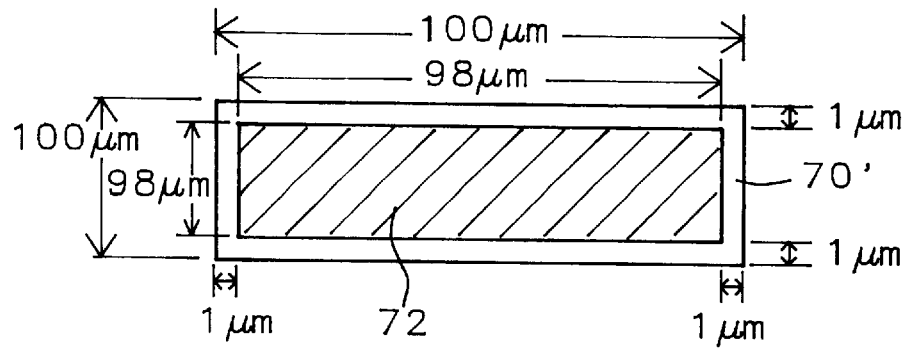

Referring to FIG. 6A and 6B, the logical operation "pad margin 1 $\mu$m" is performed with the pad size 100 $\mu$m by 100 $\mu$m in FIG. 6A for a relatively conventional AP region becoming 98 $\mu$m by 98 $\mu$m in FIG. 6B after the pad has been provided with a margin of about 1am. The new AP data area is region 72 inside the pad region 70'. For purposes of illustration, region 70' has dimensions of about 98 $\mu$m by 98 $\mu$m, which is shown as a rectangle for convenience of illustration.

Figure 3B:
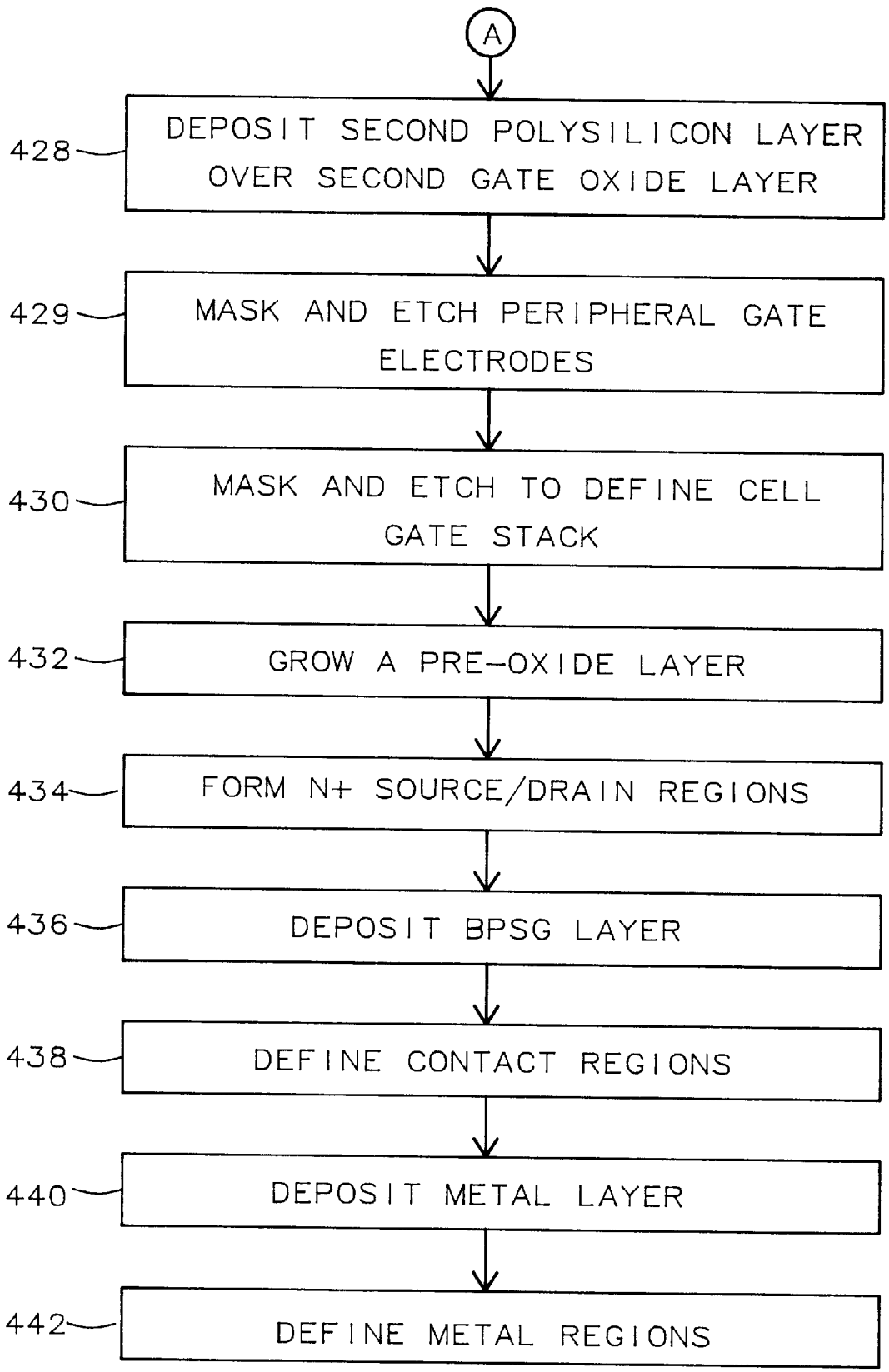

Referring now to FIG. 3B, in step 428, as shown in FIG. 4B, a second polysilicon gate electrode (polysilicon 2) layer GC2 is deposited, over the gate oxide layer GX2, with a thickness from about 22.5 nm to about 27.5 nm. The layer GC2 is doped in the same way used to dope first polysilicon layer GC1 using the process of ion implantation of ions comprising $_{31}P^+$ of the polysilicon 2 layer to form $N^+$-type doped polysilicon 2 in a relatively conventional process.

Then, in step 429, referring to FIG. 4C, a photoresist mask PR2 is formed to define the peripheral polysilicon 2 (Poly 2) gates (peripheral CMOS gates) of transistor T2 and transistor T3.

Conventional mask data: Second polysilicon layer (Poly 2P)

Invention mask data: Poly 2P+(pad margin ~3 $\mu$m).

Figure 7A:
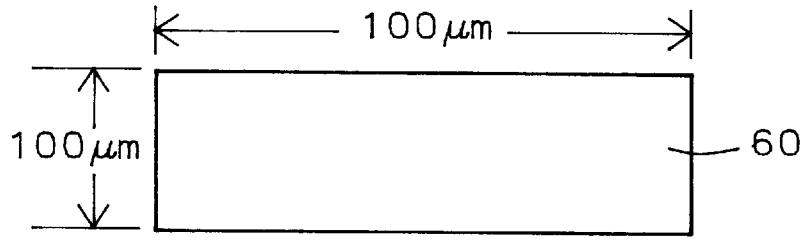
Referring to FIGS. 7A and 7B, plan views of the devices of FIGS. 6A and 6B, respectively, are shown at the stage after deposition of the second polysilicon layer which is to be patterned to form the word line and the control gates of the EPROM device, in accordance with a relatively conventional process in the case of FIG. 7A or in accordance with the process of this invention in the case of FIG. 7B.
Figure 7B:
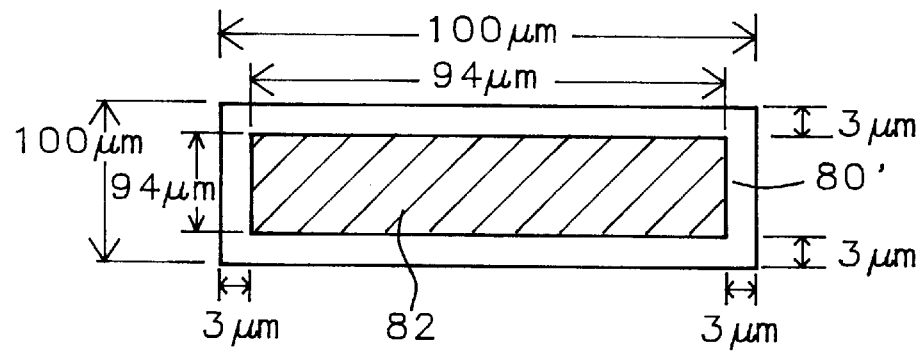

Referring to FIG. 7A and 7B, and step 429 in FIG. 3B,the "Poly 2P" operation is performed in FIG. 7A for a relatively conventional Poly 2P region becoming pad margin of about 3 $\mu$m in FIG. 6B. The new Poly 2P data area is region 82 inside the pad region 80'. For purposes of illustration, as shown in FIG. 7B, region 80' has dimensions of about 94 $\mu$m by 94 $\mu$m, which is shown as a rectangle for convenience of illustration. The pad is about 3 $\mu$m margin in that it has a margin of about 3 $\mu$m.

The next part of step 428 is the etching of the layer GC2 in the peripheral area to form the gate electrodes GC2 of transistors T2 and T3.

In FIG. 4D and step 430 of FIG. 3B, in step 430, the device 100 is shown after a third photoresist mask PR3 has been formed over the surface of device 100 and the layer GC2 has been etched into the pattern of the control gate GC2 of the EPROM transistor T1. The mask PR3 was used to define the cell polysilicon gate GC2.

(polysilicon 2/ONO/polysilicon 1.

Conventional mask data: Polysilicon 2A

Invention mask data: Polysilicon 2A

Figure 8A:
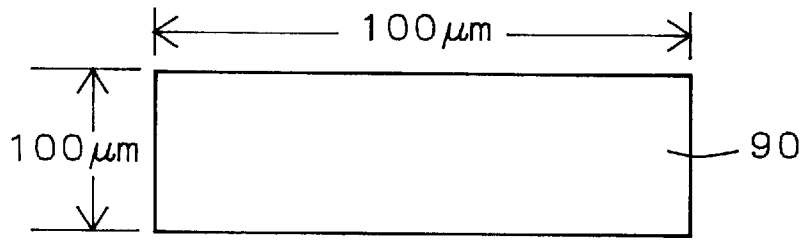
Referring to FIGS. 8A and 8B, plan views of the devices of FIGS. 7A and 7B respectively are shown at the stage during the process of masking and etching to form the cell gate stack in accordance with a relatively conventional process in the case of FIG. 8A or in accordance with the process of this invention in the case of FIG. 8B.
Figure 8B:
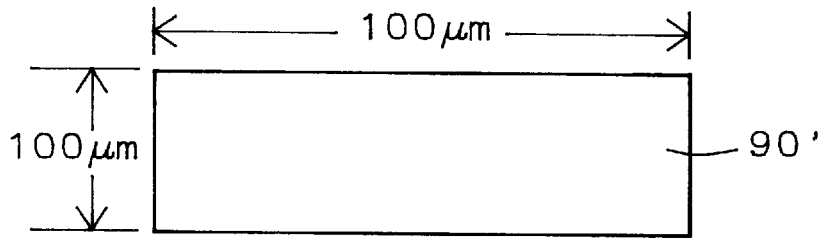

Referring again to FIG. 4D, FIG. 8A, FIG. 8B, and step 430 in FIG. 3B, the cell gate stack is being formed using the mask patterns shown in FIGS. 8A and 8B, respectively. The "Poly 2A" operation is performed in FIG. 8A in region 90 for a relatively conventional Poly 2A region 90 without any margin in FIG. 8B for new Poly 2A data. In the case of FIG. 8B in the region 90', the whole area is clear, therefore, all of the pad area is etched away in this last step in accordance with both the relatively conventional process and the process of this invention.

FIG. 4E shows the device 100 of FIG. 4D after the mask PR3 has been stripped from the device 100 with the gate structures of the three transistors EPROM transistor T1, and peripheral FET devices T2 and T3 shown.

Next, in step 432, as seen in FIG. 4F, a blanket silicon oxide layer 15 (otherwise known as a pre-oxide layer) with a thickness from about 30 nm to about 36 nm has been formed over the device 100 of FIG. 4E. The pre-oxide layer 15 is composed of silicon dioxide formed by wet oxidizing. The pre-oxide layer 15 is formed for the purpose of preventing charge leakage from the EPROM floating gate (GC1).

Then, as shown in FIG. 4F (in step 434 of FIG. 3B) a standard process of ion implantation with N type dopant ions 17 is performed to form cell N+ source/drain (S/D) (S1/D1, S2/D2, S3/D3) in substrate 110. The N+ regions formed include regions S1/D1 for the transistor T1, regions S2/D2 for the transistor T2, and regions S3/D3 for the transistor T3. The S/D regions are self-aligned with the gate structures of the transistor devices T1, T2, and T3, etc.

FIG. 4G shows the device 100 of FIG. 4F (after step 436 of FIG. 3B) of deposition of a Boro-Phospho-Silicate Glass layer BPSG over the entire device 100 covering the silicon oxide pre-oxide layer 15.

FIG. 4H shows the device 100 of FIG. 4G after the step 438 of defining the contact region.

Then in step 440, a metal layer is deposited and in step 442 defined in accordance with well known processing techniques to produce the result seen in FIG. 4H.

Referring to FIG. 1, the normal etching region does not include the pad area. The method of this invention generates a pad area, a scribe line and a frame cell region for enlarging a small exposed field. The scribe line is defined as a line formed along the periphery of a chip to be formed by dicing of the semiconductor substrate 11 after the devices have been completed. The frame cell region comprises the border of a set of chips to be formed on the semiconductor substrate 11.

The present invention can apply to the process modules. For example, in a BiCMOS (Bipolar CMOS) device (which can be an EPROM or DRAM device, etc.) the emitter contact, the fine-definition of the buried contact of embedded and non-embedded memory, and the extrinsic base contact.

EXAMPLES OF THE INVENTION

1. The end point detection capability of the cell polysilicon 2 self-aligned etch is increased.

2. The end point failure of the cell polysilicon 2 self-aligned etch is solved.

3. The trench depth of source line is reduced and can be controlled.

4. The polysilicon 2 self-aligned etching process window can be improved by reducing the micro-loading in the EPROM memory area.

A self-aligned polysilicon 2/ONO/polysilicon 1 array on an embedded EPROM device is formed by the process comprising the following steps.

For embedded EPROM devices the exposed area for the polysilicon 2 SAE (Self-Aligned Etching) in which the polysilicon 2 layer, wherein the ONO layer and the polysilicon 1 layer are etched is very small for embedded EPROM (see FIG. 1 and FIG. 2), the end point detection capability is very bad. In order to improve the end point detection capability of polysilicon 2 SAE, the area exposed to etching must be increased to a certain level. The purpose of the invention is to deposit and pattern the polysilicon 2, ONO, and polysilicon 1 layers on pads region before the cell polysilicon 2 SAE step. To achieve the polysilicon 2, ONO, and polysilicon 1 layers remaining on pads region before polysilicon 2 SAE step, the polysilicon 1, ONO, and polysilicon 2 layers must be protected on pads region from defining polysilicon 1, array protection, and peripheral polysilicon 2. The remaining layers on the pad area will be etched off at the cell polysilicon 2 SAE step. Originally, there were not any remaining layers on the pad region except for a typical field oxide before polysilicon 2 self-aligned etching step.

This invention increases more than 50% end point detection capability when presenting the cell polysilicon 2 SAE in processing.

SUMMARY

Principal defining features of the method of this invention are as follows:

1. Define the floating gate structure comprising the ONO layer 120/polysilicon 1 layer GC1/gate oxide layer GX1.

2. Define the array protection mask.

3. Grow the second gate oxide layer GX2.

4. Deposit the polysilicon 2 layer.

5. Define the peripheral polysilicon 2 gate (peripheral CMOS).

6. Define the cell polysilicon gate (second polysilicon layer GC2/ONO layer 120/first polysilicon layer GC1 in a self-aligned etch.

Note the following features. The polysilicon 1 etching region excludes pads in the chip and test lines. The array protection includes pads in the chip and test lines. Also, the peripheral polysilicon 2 etching region excludes the pads in the chip and test lines; and the cell polysilicon 2 self-aligned etching region includes pads in the chip and test lines.

In summary, the process of this invention includes the steps, as follows:

1. Grow a gate oxide layer on the substrate (25 nm) (FIG. 4A).

2. Deposit a polysilicon 1 layer on the gate oxide layer (200 nm) (FIG. 4A).

3. Perform ion implantation to dope the polysilicon 1 layer GC1 (FIG. 4A).

4. Grow a polyoxide film (15 nm) for first film of ONO layer 120 (FIG. 4A).

5. Deposit a silicon nitride film (15 nm) for second film of ONO layer 120 (FIG. 4A).

6. Form a silicon oxide on the silicon nitride film (−2.5 nm) for third film of ONO layer 120 (FIG. 4A).

7. Define the floating gate stack by etching the ONO layer 120/polysilicon 1 layer GC1/first gate oxide layer GX1 plus etching the polysilicon 1 of the pads which have the 4 μm margins (FIG. 4A, FIG. 5B).

8. Define the array protection (AP) plus pad margins of −1 μm) (FIG. 4A, FIG. 6B).

9. Grow gate oxide 2 layer GX2 (FIG. 4B).

10. Deposit a polysilicon 2 electrode layer (FIG. 4B).

11. Define the peripheral polysilicon 2 gate (peripheral CMOS/gate) and an −3 μm pad margin (FIGS. 4C and 7B).

12. Define the cell polysilicon gate(polysilicon (FIG. 4C). 2/ONO/polysilicon 1 self-aligned etch) and pad area is etched away (FIG. 4D, FIG. 4E, FIG. 8B).

13. Grow a silicon oxide pre-oxide layer 15 (FIG. 4F).

14. Form cell N+ S/D regions S1/D1, S2/D2, S3/D3 in substrate (FIG. 4F).

15. Deposit a blanket BPSG dielectric layer (FIG. 4G).

16. Define contact regions (FIG. 4H).

17. Deposit a metallization layer.

18. Define the metallization regions by conventional steps.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a semiconductor device comprising:

forming a series of layers of metallization and dielectric layers in manufacturing a semiconductor device and patterning said layers into devices using phototlithography and etching process steps including providing a surplus pad area surrounding an area to be made into a pad area during pad formation, and thereby increasing the exposed pad area during etching, whereby the end point detection capacity is enhanced by provision of said surplus pad area before pad formation.

2. A method of forming a MOSFET device including forming a series of layers of metallization and dielectric layers in forming a semiconductor device and patterning said layers into devices using phototlithography and etching process steps, including the steps comprising:

forming a first polysilicon electrode layer above a first gate oxide layer on a substrate, forming an interelectrode dielectric layer defining array protection, growing a second gate oxide layer, depositing a second polysilicon electrode layer, defining peripheral gates, providing a surplus pad area with margins surrounding an area to be made into a pad area during pad formation, defining the main transistor gate electrode, wherein the area exposed during etching is increased to enhance the end point detection capacity, by adding said surplus pad areas before pad formation.

3. A method in accordance with claim 2 wherein the steps are performed comprising:

growing said gate oxide layer on said substrate, forming said first polysilicon electrode layer on said first gate oxide layer, said first polysilicon electrode layer being doped, forming an interconductor dielectric layer over said first polysilicon electrode layer, defining a floating gate stack by etching said interconductor dielectric layer, said first polysilicon electrode layer and said first gate oxide layer plus etching said first polysilicon electrode layer of said surplus pad areas in a pattern with margins, defining the array protection including pad margins to provide said surplus pad areas, growing a second gate oxide layer over said device, depositing a second polysilicon electrode layer over said second gate oxide layer, defining the peripheral gates from said second polysilicon electrode layer including surplus pad areas, defining the cell polysilicon gate including the second polysilicon electrode layer, interconductor dielectric layer, and said first polysilicon electrode layer in a self-aligned etch wherein said surplus pad area is etched away, growing a silicon oxide pre-oxide layer, forming cell N+ S/D regions in said substrate, depositing a blanket dielectric layer over said device, defining contact regions, depositing a metallization layer, and defining the metallization regions.

4. A method in accordance with claim 3 wherein the steps are performed to form said interconductor dielectric layer comprising:

growing a polyoxide layer for a first film of said interconductor dielectric layer, depositing a silicon nitride layer for a second film of said interconductor dielectric layer, and forming an oxide on said silicon nitride layer for a third film of said interconductor dielectric layer.

5. A method of forming a MOSFET EPROM device including a series of layers of metallization and dielectric layers in forming a semiconductor device on a substrate and patterning said layers into devices using phototlithography and etching process steps, including the steps comprising:

forming a first polysilicon electrode layer above a gate oxide layer forming an interconductor dielectric layer above said floating gate electrode, patterning a floating gate electrode of an EPROM device from said first polysilicon electrode, said gate oxide layer and said interconductor dielectric layer, defining array protection, growing a second gate oxide layer, depositing a second polysilicon electrode layer, defining peripheral gates from said second level of polysilicon, providing a surplus pad area before pad formation with margins surrounding an area to be made into a pad area during pad formation, and defining an EPROM transistor control gate electrode from said second level of polysilicon, whereby adding said surplus pad area enhances the use of end point mode detection in the etching process by increasing the area exposed during etching to enhance the end point detection capacity.

6. A method in accordance with claim 5 wherein the steps are performed comprising:

growing said gate oxide layer on said substrate with a thickness of about 25 nm, forming said first polysilicon electrode layer on said first gate oxide layer, said first polysilicon electrode layer having a thickness of about 200 nm and being doped, forming an interconductor dielectric layer over said first polysilicon electrode layer, defining a floating gate stack by etching said interconductor dielectric layer, said first polysilicon electrode layer and said first gate oxide layer plus etching said first polysilicon electrode layer of said surplus pad areas in a pattern with margins, defining the array protection including pad margins about said surplus pad areas, growing a second gate oxide layer over said device, depositing a second polysilicon electrode layer over said second gate oxide layer, defining the peripheral gates from said second polysilicon electrode layer including surplus pad areas, defining the cell polysilicon gate including the second polysilicon electrode layer, interconductor dielectric layer, and said first polysilicon electrode layer in a self-aligned etch wherein said surplus pad area is etched away growing a silicon oxide pre-oxide layer, forming cell N+ S/D regions in said substrate, depositing a blanket dielectric layer over said device, defining contact regions, depositing a metallization layer, and defining the metallization regions in the conventional manner.

7. A method in accordance with claim 6 wherein the steps are performed to form said interconductor dielectric layer comprising:

growing a polyoxide layer with a thickness of about 15 nm for a first film of said interconductor dielectric layer, depositing a silicon nitride layer with a thickness of about 15 nm for a second film of said interconductor dielectric layer, and forming an oxide on said silicon nitride layer with a thickness of about 2.5 nm for a third film of said interconductor dielectric layer.

* * * * *